(12) United States Patent
Zhan et al.

(10) Patent No.: US 11,689,174 B2
(45) Date of Patent: Jun. 27, 2023

(54) ISOLATION COMMUNICATIONS CHANNEL USING DIRECT DEMODULATION AND DATA-EDGE ENCODING

(71) Applicant: Skyworks Solutions, Inc., Irvine, CA (US)

(72) Inventors: Huanhui Zhan, Austin, TX (US); Krishna Pentakota, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 17/335,839

(22) Filed: Jun. 1, 2021

(65) Prior Publication Data
US 2022/0385258 A1  Dec. 1, 2022

(51) Int. Cl.
H03H 7/01 (2006.01)
H03B 5/12 (2006.01)
H04B 1/40 (2015.01)

(52) U.S. Cl.
CPC ......... *H03H 7/0115* (2013.01); *H03B 5/1212* (2013.01); *H04B 1/40* (2013.01)

(58) Field of Classification Search
CPC ...... H03H 7/0115; H03B 5/1212; H04B 1/40; H04L 27/06; H04L 25/0266; H04L 25/0272; H03K 5/1252
See application file for complete search history.

(56) References Cited

U.S. PATENT DOCUMENTS

| | | | |
|---|---|---|---|
| 4,570,128 A | 2/1986 | Monticelli | |
| 6,307,443 B1 * | 10/2001 | Gabara | H03H 7/12 333/17.1 |
| 7,489,526 B2 | 2/2009 | Chen et al. | |
| 7,679,162 B2 | 3/2010 | Dupuis et al. | |
| 7,688,869 B2 | 3/2010 | Adam et al. | |
| 7,706,154 B2 | 4/2010 | Chen et al. | |
| 7,902,627 B2 | 3/2011 | Dong et al. | |
| 8,169,108 B2 | 5/2012 | Dupuis et al. | |
| 8,198,951 B2 | 6/2012 | Dong et al. | |
| 8,441,325 B2 | 5/2013 | Callahan et al. | |
| 8,478,332 B2 | 7/2013 | Giombanco et al. | |
| 8,502,584 B1 * | 8/2013 | Dong | H04B 3/30 375/219 |
| 8,861,229 B2 | 10/2014 | Alfano et al. | |
| 8,878,560 B2 | 11/2014 | Kuo et al. | |

(Continued)

OTHER PUBLICATIONS

Analog Devices, Inc., "Dual-Channel, 2.5 kV Isolators with Integrated DC-to-DC Converter," Data Sheet ADuM5200/ADuM5201/ADuM5202, 2009-2012, 28 pages.

(Continued)

*Primary Examiner* — Aristocratis Fotakis
(74) *Attorney, Agent, or Firm* — Knobbe, Martens, Olson & Bear, LLP (57) ABSTRACT

An apparatus for communicating across an isolation barrier includes a differential pair of input terminals. The apparatus includes a bandpass filter circuit configured to receive a received signal on the differential pair of input terminals and to provide a received differential signal on a differential pair of nodes. The apparatus includes a demodulator directly coupled to the bandpass filter circuit and configured to directly demodulate the received differential signal on the differential pair of nodes to provide a demodulated received signal.

18 Claims, 6 Drawing Sheets

(56) References Cited

U.S. PATENT DOCUMENTS

| | | |
|---|---|---|
| 9,035,422 B2 | 5/2015 | Khanolkar et al. |
| 9,367,072 B2 | 6/2016 | Al-Shyoukh et al. |
| 9,425,682 B2 | 8/2016 | Al-Shyoukh et al. |
| 9,537,581 B2 | 1/2017 | Mills et al. |
| 9,564,863 B1 | 2/2017 | Giridharan |
| 9,698,654 B2 | 7/2017 | Santos et al. |
| 9,812,989 B1 | 7/2017 | Dupuis et al. |
| 9,923,643 B2 | 3/2018 | Dupuis et al. |
| 10,326,375 B1 | 6/2019 | Pentakota et al. |
| 10,511,273 B2 | 12/2019 | Al-Shyoukh |
| 10,826,334 B2 | 11/2020 | Pentakota et al. |
| 10,833,535 B2 | 11/2020 | Al-Shyoukh et al. |
| 10,840,861 B1 | 11/2020 | Al-Shyoukh |
| 10,840,960 B1 | 11/2020 | Al-Shyoukh |
| 2001/0041548 A1 | 11/2001 | Bult |
| 2002/0150151 A1 | 10/2002 | Krone et al. |
| 2003/0091140 A1 | 5/2003 | Dupuis et al. |
| 2003/0218502 A1 | 11/2003 | MacTaggart et al. |
| 2004/0057524 A1 | 3/2004 | Krone et al. |
| 2004/0190670 A1 | 9/2004 | Dupuis et al. |
| 2004/0219898 A1 | 11/2004 | Bult |
| 2005/0100104 A1 | 5/2005 | Dupuis et al. |
| 2005/0285674 A1 | 12/2005 | Zaguri |
| 2006/0049881 A1 | 3/2006 | Rein |
| 2007/0075813 A1 | 4/2007 | Zhang |
| 2007/0080360 A1 | 4/2007 | Mirsky |
| 2007/0139032 A1 | 6/2007 | Dupuis et al. |
| 2007/0246805 A1 | 10/2007 | Zhang et al. |
| 2008/0013635 A1 | 1/2008 | Dupuis |
| 2008/0025450 A1 | 1/2008 | Alfano et al. |
| 2008/0031286 A1 | 2/2008 | Alfano et al. |
| 2008/0119142 A1 | 5/2008 | Dupuis |
| 2008/0136383 A1 | 6/2008 | Hasegawa et al. |
| 2008/0164955 A1 | 7/2008 | Pfeiffer |
| 2008/0192509 A1 | 8/2008 | Dhuyvetter |
| 2008/0205564 A1 | 8/2008 | Sugawara et al. |
| 2008/0260050 A1 | 10/2008 | Dupuis |
| 2008/0267301 A1 | 10/2008 | Alfano et al. |
| 2008/0279288 A1* | 11/2008 | Crawley ............ H04L 25/0272 375/244 |
| 2009/0017773 A1 | 1/2009 | Dupuis et al. |
| 2010/0052826 A1 | 3/2010 | Callahan et al. |
| 2010/0118918 A1 | 5/2010 | Dupuis |
| 2010/0141340 A1 | 6/2010 | Huang et al. |
| 2013/0207722 A1 | 8/2013 | Bulzacchelli |
| 2013/0278438 A1 | 10/2013 | Mueck |
| 2014/0126254 A1 | 5/2014 | Al-Shyoukh et al. |
| 2014/0153296 A1 | 6/2014 | Pan |
| 2014/0169038 A1* | 6/2014 | Kamath ................ H03D 3/00 363/16 |
| 2014/0177290 A1 | 6/2014 | Zhang |
| 2014/0266373 A1 | 9/2014 | Goswami et al. |
| 2014/0375138 A1 | 12/2014 | Sako |
| 2015/0063434 A1* | 3/2015 | Sonntag ............ H04L 25/4902 375/238 |
| 2015/0145446 A1 | 5/2015 | Shitabo |
| 2015/0171901 A1 | 6/2015 | Dupuis et al. |
| 2015/0381219 A1* | 12/2015 | Kramer ................ H03F 1/02 375/297 |
| 2016/0036340 A1 | 2/2016 | Kikuchi |
| 2016/0080183 A1 | 3/2016 | Yun et al. |
| 2017/0346406 A1 | 11/2017 | Bucheru |
| 2018/0278229 A1 | 9/2018 | Sankaran et al. |
| 2018/0323759 A1 | 11/2018 | Cojocaru |
| 2018/0348295 A1 | 12/2018 | Stroud et al. |
| 2019/0068071 A1 | 2/2019 | Jia |
| 2019/0068410 A1 | 2/2019 | Al-Shyoukh et al. |
| 2019/0181817 A1 | 6/2019 | Al-Shyoukh et al. |
| 2019/0278245 A1* | 9/2019 | Singh ................ G01R 31/317 |
| 2019/0305608 A1 | 10/2019 | Pentakota et al. |
| 2020/0279602 A1* | 9/2020 | Nasum ................ G11C 7/1009 |
| 2021/0033662 A1* | 2/2021 | Al-Shyoukh ...... H01R 13/6461 |
| 2021/0036662 A1 | 2/2021 | Al-Shyoukh |

OTHER PUBLICATIONS

Analog Devices, Inc., "Hot Swappable, Dual 12C Isolators with Integrated DC-to-DC Converter," Data Sheet ADM3260, 2013-2016, 19 pages.

Analog Devices, Inc., "Quad-Channel, 5 kV Isolators with Integrated DC-to-DC Converter," Data Sheet ADuM6400/ADuM6401/ADuM6402/ADuM6403/ADuM6404, 2009-2012, 28 pages.

Electronics-Tutorials, "Input Impedance of an Amplifier," downloaded from https://www.electronics-tutorials.ws/amplifier/input-impedance-of-an-amplifier.html, May 10, 2019, 11 pages.

Fanori, L. and Andreani, P., "Class-D CMOS Oscillators," IEEE Journal of Solid-State Circuits, vol. 48, No. 12, Dec. 2013, pp. 3105-3119.

Lafevre, K., "Design of a Modified Cherry-Hooper Transimpedance Amplifier with DC Offset Cancellation," Arizona State University, Aug. 2011, 64 pages.

Silicon Laboratories Inc., "Low-Power, Single and Dual-Channel Digital Isolators," Si8410/20/21 Si8422/23, Rev. 1.3 Mar. 12, 2012, 38 pages.

Silicon Laboratories Inc., "1MBPS, 2.5KVRMS Digital Isolators," Si86xx, Jun. 2015, Rev. 1.0, 52 pages.

Silicon Laboratories Inc., "5 KV LED Emulator Input, Open Collector Output Isolators," Si87xx, Apr. 2014, Rev 1.1, 39 pages.

Silicon Laboratories Inc., "Dual Digital Isolators with DC-DC Converter," Si88x2x, Jul. 2015, 45 pages.

Silicon Laboratories Inc., "Low-Power Quad-Channel Digital Isolators," Si864x Data Sheet, Sep. 2019, Rev. 2.15, 44 pages.

Tsai, C.T., and Chou, H.P., "A Synthetic Ripple Buck Converter with Dynamic Hysteretic Band Modulation," International Conference on Power Electronics and Drive Systems, PEDS 2009, pp. 170-174.

\* cited by examiner

ISOLATION COMMUNICATIONS CHANNEL USING DIRECT DEMODULATION AND DATA-EDGE ENCODING

BACKGROUND

Field of the Invention

The invention relates to isolation technology and more particularly to communication across an isolation barrier.

Description of the Related Art

In a typical control application, a processor system provides one or more control signals for controlling a load system. During normal operation, a large DC or transient voltage difference may exist between the domain of the processor system and the domain of the load system, thus requiring an isolation barrier between the processor system and the load system. For example, one domain may be "grounded" at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load by a direct conduction path, an isolation communications channel allows communication between the two systems using optical (opto-isolators), capacitive, inductive (transformers), or electromagnetic techniques.

Transients caused by relative differences between the ground of the transmitter circuit relative to the second ground of the receiver circuit are referred to as common mode transient events. A substantial common mode transient current flows through the isolation barrier capacitors. Ideally, circuit components are perfectly matched and the common mode transient current does not cause a differential event between terminals RX(+) and RX(-). However, in practice, mismatch of actual circuit elements in the differential path and other factors cause the common mode transient current to generate a differential pulse at the input of the receiver circuit. That differential pulse can corrupt a recovered digital signal. Receiver circuits that implement techniques to reduce or eliminate such differential pulses and the associated data corruption are considered to have common mode transient immunity.

Conventional common mode transient suppression techniques use deglitching techniques that introduce substantial delay (e.g., a delay that is equal to a deglitching time $T_D$) into the receiver signal path. Deglitching circuits can suppress only common mode transient events that are faster than deglitching time $T_D$ (i.e., common mode transient events that have an event duration (e.g., pulse width) less than $T_D$ of the deglitching circuit). Typically, deglitching circuits are tailored to target events having particular durations and a design may include multiple deglitching circuits or a programmable deglitching circuit that is configured for a target application during characterization and production testing. Those conventional techniques cause gaps in the range of common mode transient suppression, leaving the system vulnerable to fault conditions. In addition, some applications cannot tolerate the additional propagation delay introduced by one or more deglitching circuits (e.g., high-rate data transfer applications in which added propagation delay effectively reduces the data rate, and half and full bridge power stages for power and audio applications in which added propagation delay may require increased dead times that negatively impact performance of those power stages).

Figure 1:
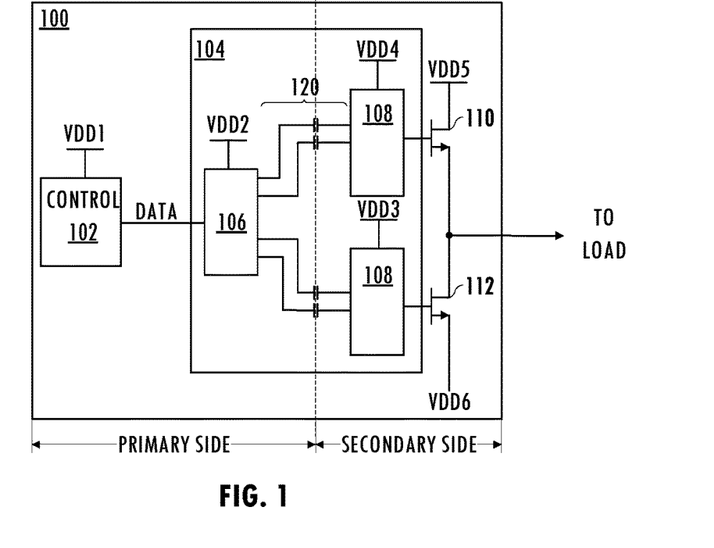
FIG. 1 illustrates a functional block diagram of an exemplary isolator system.

Referring to FIG. 1, in an exemplary application, controller 102, which may be a microprocessor, microcontroller, or other suitable processing device, operates in a first domain (i.e., a domain including VDD1, e.g., 5 Volts (V)) and provides one or more signals (e.g., DATA) for a high power load system operating in a second domain (i.e., a domain including VDD5 and VDD6, e.g., 150V and -150V, respectively, for an exemplary class D audio application) using isolator 104. Isolator 104 includes isolation communications channel 120, which may isolate the domains on a first side of system 100, e.g., the primary side including VDD1 (e.g., less than ten volts) and VDD2 (e.g., less than ten volts) and devices coupled thereto, and a second side of system 100, e.g., the secondary side including VDD3 and VDD4 (e.g., tens of volts) and VDD5 and VDD6 (e.g., hundreds of volts) and devices coupled thereto. In the exemplary class D audio application, the voltage VDD3-$V_{S112}$ is equal to a constant voltage (e.g., 10V-30V) and the voltage VDD4-$V_{S110}$ is equal to a constant voltage (e.g. 10V-30V), where $V_{S110}$ and $V_{S112}$ are the voltage on the source node of device 110 and the voltage on the source node of device 112, respectively.

Isolation communications channel 120 facilitates safe communication of a signal received from controller 102 in the primary side to the secondary side. The secondary side includes driver circuitry (e.g., included in receiver circuits 108), which generates an output control signal based on the signal received from the primary side and provides a suitable drive signal to device 110 and device 112. In an exemplary embodiment, isolator 104 includes multiple integrated circuits configured as a multi-chip module in a single package. For example, isolator 104 includes a primary side integrated circuit (e.g., transmitter circuit 106) and a secondary side integrated circuit (e.g., receiver circuits 108). However, other embodiments of isolator 104 include one receiver circuit 108 or additional transmitter circuits 106 and/or additional receiver circuits 108. Transmitter circuit 106 and receiver circuit 108 include terminals that may be pins of corresponding packages included in a package of the multi-chip module. Those terminals may be coupled to external elements, e.g., transformers, discrete resistors, and discrete capacitors within the multi-chip module or to terminals of the package of the multi-chip module, and a package of controller 102. In other embodiments, transmitter circuit 106 is formed on a first integrated circuit die and receiver circuit 108 is formed on another integrated circuit die, both of which are attached to a lead frame and include terminals coupled to isolation communications channel 120 formed on the lead frame and packaged as a single device. In still other embodiments, transmitter circuit 106 and receiver circuit 108 include terminals coupled to isolation communications channel 120, all of which are formed on an integrated circuit die. Isolation communications channel 120 allows safe communication of signals from controller 102 to receiver circuits 108, which drive high-power drive devices 110 and 112 used to deliver power to a load system. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, and other suitable devices able to deliver high power signals.

In at least one embodiment of system 100, isolation communications channel 120 blocks DC signals and only passes AC signals. Isolation communications channel 120 is illustrated as including capacitive isolation, although other suitable isolation techniques may be used. Isolation communications channel 120 uses on-off keying to communicate one or more digital signals (e.g., DATA) between transmitter circuit 106 and receiver circuit 108. In general, on-off keying (OOK) is a form of amplitude-shift keying modulation that represents digital data as the presence or absence of a carrier wave or oscillating signal. The presence of the carrier for a particular duration represents a binary one, while its absence for the same duration represents a binary zero. On-off keying signaling is robust for isolation in driver applications because a logic '0' state sends the same signal (e.g., nothing) as when the primary side loses power and the device gracefully assumes its default state. That behavior is advantageous in driver applications because it will not accidentally turn on a device being driven, even when the primary side loses power. Conventional OOK isolated drivers use medium frequency differential carrier signals to communicate across the isolation communications channel. Under some circumstances, on-off keying consumes a substantial amount of power, which increases with increases to the frequency of the oscillator.

Figure 2:
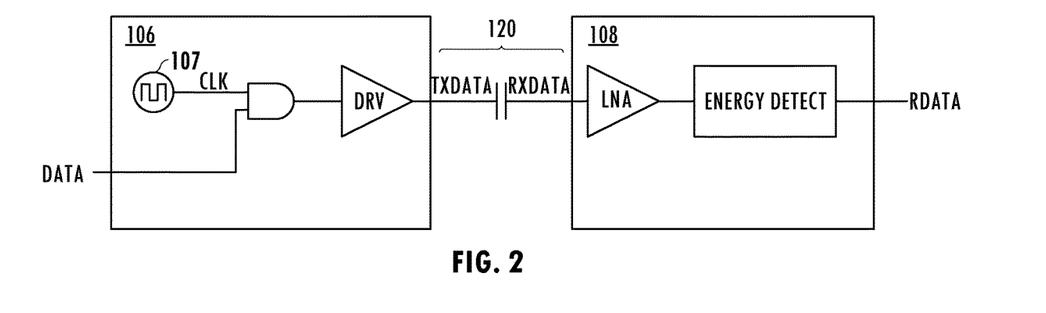
FIG. 2 illustrates a functional block diagram of an exemplary isolation communications system.
Figure 3:
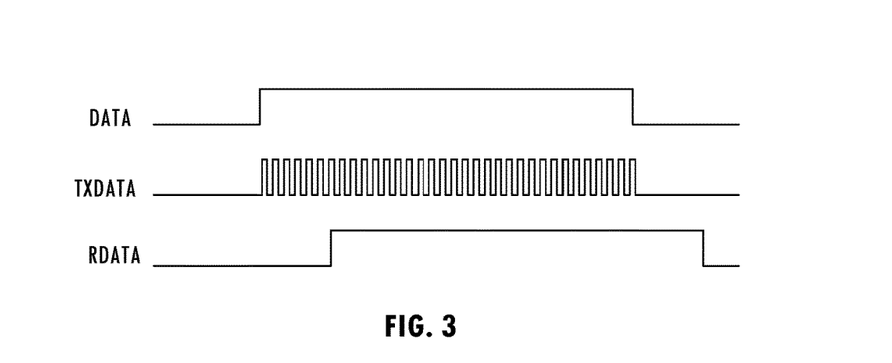
FIG. 3 illustrates waveforms for the isolator communications system of FIG. 2.

Transmitter circuit 106 receives DATA asynchronously to an internal clock and generates an on-off keying representation of the digital signal of DATA by providing a signal that oscillates when DATA has a first value (e.g., a high value, i.e., a signal level indicating a digital '1') and is constant when DATA has a second value (e.g., a low value, i.e., a signal level indicating a digital '0'). Referring to FIGS. 2 and 3, a typical technique generates that representation of DATA using a logical AND of the carrier clock signal, CLK, with DATA. Carrier clock 107 has a frequency much greater than a frequency associated with the DATA. By driving a differential signal representing DATA on a capacitively coupled conductor of isolation communications channel 120, a representation of DATA is received by receiver circuit 108, which may amplify that representation using a low-noise amplifier and detect the digital data of that received representation using energy detection or other suitable technique. Receiver circuit 108 generates a recovered digital signal, RDATA, which is a recovered version of DATA. The recovered digital signal, RDATA, may exhibit jitter that is approximately $T_{CLK}/2$ since DATA can arrive at transmitter circuit 106 at any time during the period $T_{CLK}$ of clock 107.

Figure 4:
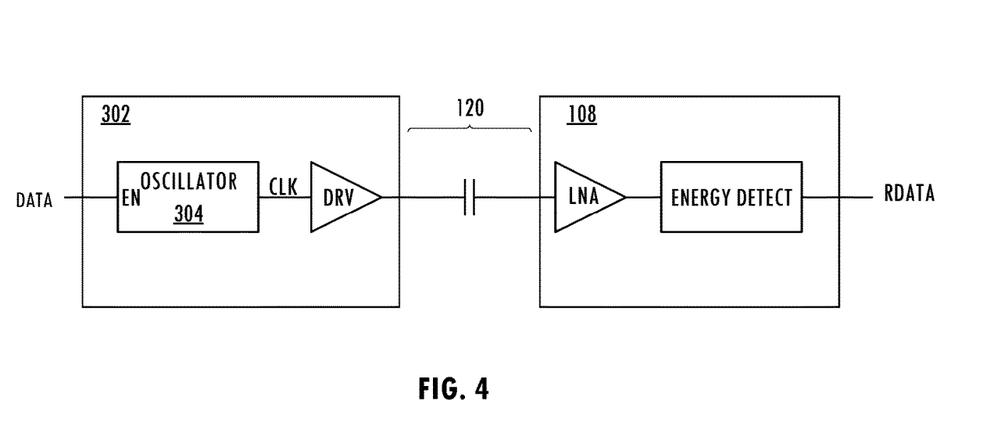
FIG. 4 illustrates a functional block diagram of an exemplary low-jitter isolator system.
Figure 5:
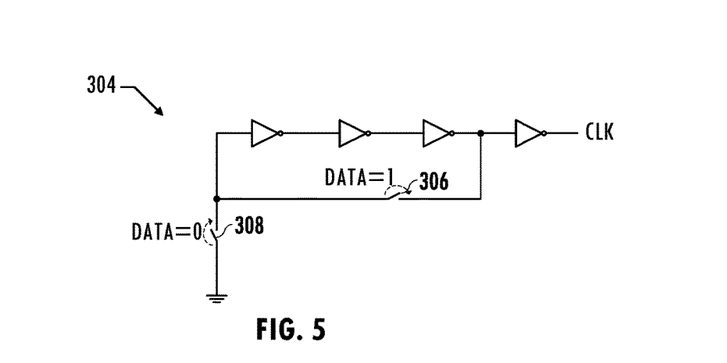
FIG. 5 illustrates a circuit diagram of an exemplary oscillator of the low-jitter isolator system of FIG. 4.
Figure 6:
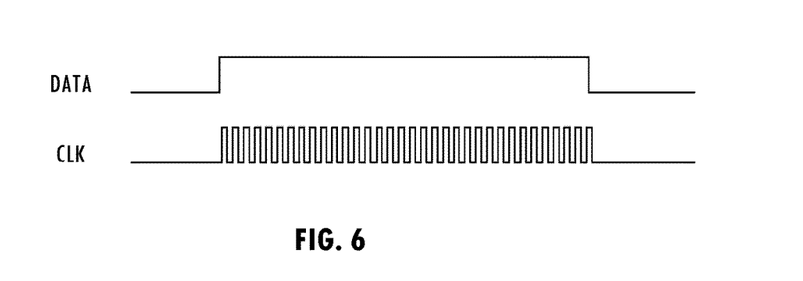
FIG. 6 illustrates waveforms for the low-jitter isolator system of FIG. 4.

Referring to FIGS. 4-6, in at least one embodiment of a digital isolator system, a primary side device generates a representation of a data signal to be communicated over an isolation communications channel improving an edge (i.e., reducing the jitter associated with a data transition) by starting and stopping the oscillator 304 in transmitter circuit 302 using DATA as the enabling signal. For example, oscillator 304 is a ring oscillator that includes switches 306 and 308. Switch 306 is closed when DATA has a high value (i.e., DATA='1') and is open otherwise. Switch 308 is closed when DATA has a low value (i.e., DATA='0') and is open otherwise. The resulting signal, CLK, is used as the representation of DATA that is transmitted across isolation communications channel 120. This technique makes the rising transition of RDATA independent of the frequency of oscillator 304 and reduces jitter on the rising edge of RDATA.

Oscillator 304 uses a complementary metal-oxide-semiconductor (CMOS) inverter to drive the isolation communications channel using medium frequency differential carrier signals (e.g., approximately 500 MHz). Higher frequency transmission implements channel gain, due to high-pass nature of isolation communications channel 120, to reduce challenges on RX design and improve signal to common mode noise transient (CMT) ratio (SNR) as noise transient is limited to lower frequency band. However, a higher frequency CMOS inverter transmitter demands advanced manufacturing process but the typical process for CMOS isolator is limited by cost and isolation requirements, which limits applications to older processes. Thus, improved techniques for communicating across an isolation barrier with common mode transient immunity are desired.

SUMMARY OF EMBODIMENTS OF THE INVENTION

In at least one embodiment, an apparatus for communicating across an isolation barrier includes a differential pair of input terminals. The apparatus includes a bandpass filter circuit configured to receive a received signal on the differential pair of input terminals and to provide a received differential signal on a differential pair of nodes. The apparatus includes a demodulator directly coupled to the bandpass filter circuit and configured to directly demodulate the received differential signal on the differential pair of nodes to provide a demodulated received signal.

In at least one embodiment, a method for communicating across an isolation barrier includes bandpass filtering a received signal on a differential pair of input terminals to provide a received differential signal on a differential pair of nodes. The method includes directly demodulating the received differential signal on the differential pair of nodes to provide a demodulated received signal.

In at least one embodiment, a method for communicating across an isolation barrier includes generating a data-edge-encoded signal based on a data signal using an LC oscillator circuit. The method includes transmitting the data-edge-encoded signal across the isolation barrier.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 7:
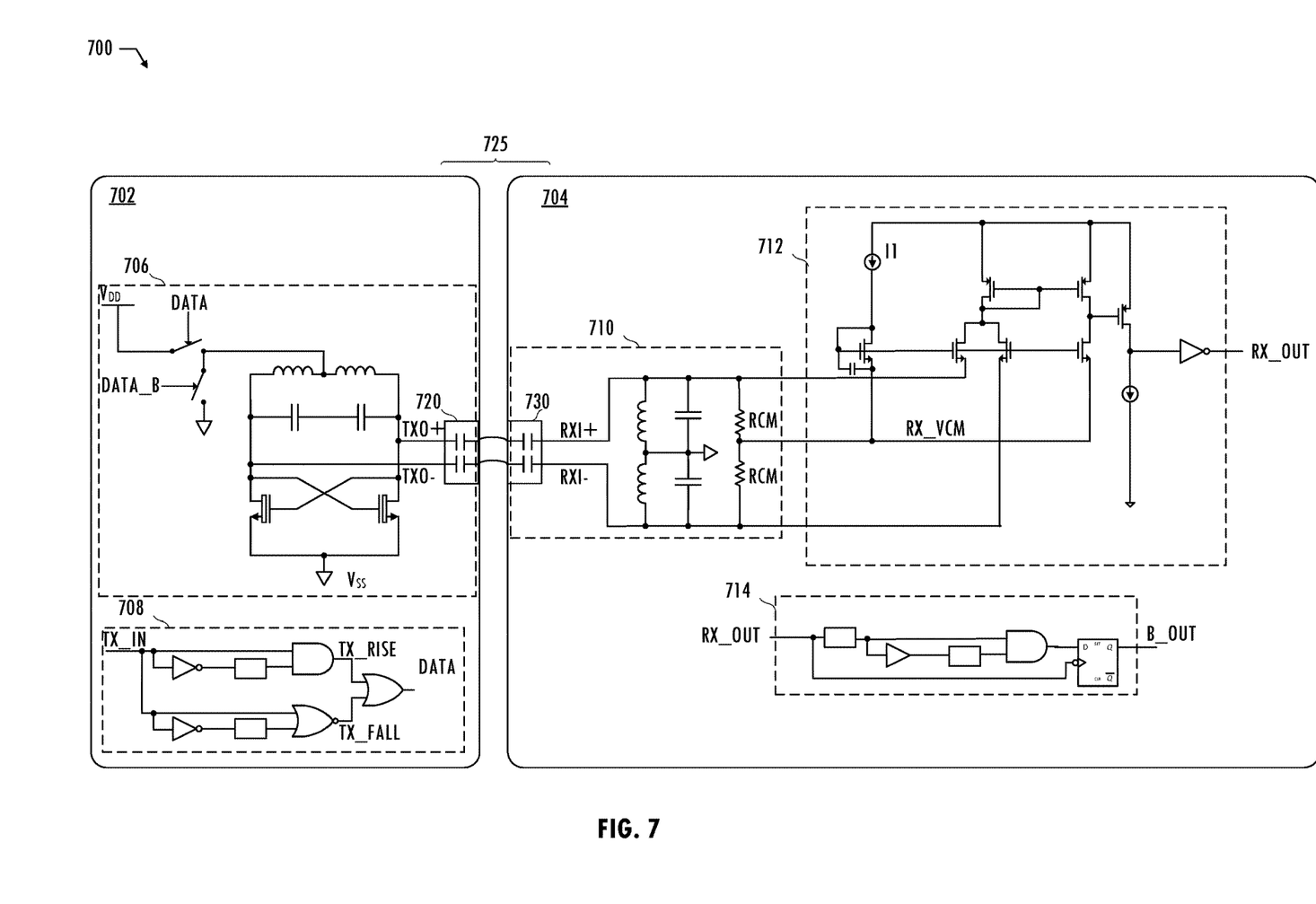
FIG. 7 illustrates a functional block diagram of an exemplary isolation communications system consistent with at least one embodiment of the invention.
Figure 8:
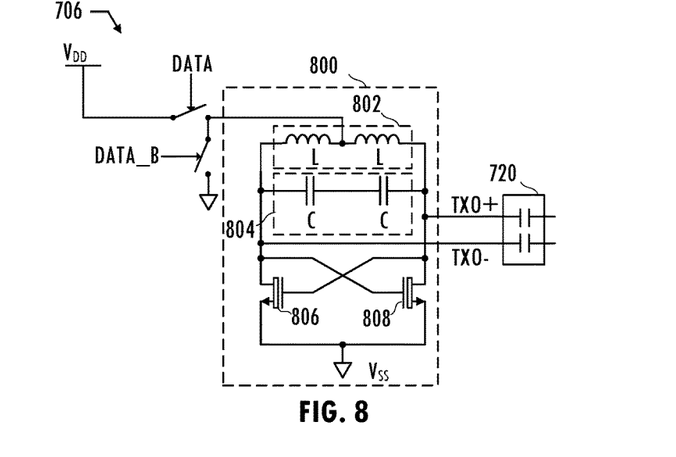
FIG. 8 illustrates a functional block diagram of an exemplary transmitter of the isolation communications system of FIG. 7 consistent with at least one embodiment of the invention.

An isolation communications system having low power consumption and common-mode transient immunity is described. The isolation communications system uses reliably enables data-edge-encoding and decoding that only enables the transmitter for a limited interval of the duty cycle during input data transition and provides a data-rate scalable ultra-low power channel operation. Referring to FIGS. 7 and 8, in at least one embodiment the isolation communications system includes transmitter 702 on a first integrated circuit die and receiver 704 on a second integrated circuit die that communicate across isolation barrier 725. In at least one embodiment, transmitter 702 includes an embodiment of oscillator 800 that includes passive on-chip inductor 802, capacitance 804, transistor 806, and transistor 808 and is configured to drive an oscillating signal on differential pair of nodes TXO+ and TXO−, which are coupled to isolation capacitors 720 of the isolation barrier. In at least one embodiment of isolation communications system 700, transistor 806 and transistor 808 are cross-coupled and are formed using gate oxide layers that are thicker than gate oxide layers of other transistors of isolation communications system 700 and have different breakdown voltages and speeds of operation than the other transistors that are formed from thinner gate oxide layers.

Unlike the ring oscillator described above, the oscillation frequency of oscillator 800, which is formed using an inductor and capacitor, is not limited by manufacturing process and easily achieves high frequency oscillation (e.g., a frequency of at least 5 GHz). High frequency oscillation increases the gain of the oscillator (e.g., increases at least ten times, i.e., 20 dB) as compared to using a carrier with a frequency of approximately 500 MHz. In addition, depending on the mode of oscillation (e.g., class-C or class-D operation), the amplitude of an oscillating signal generated by oscillator 800 can exceed VDD, thereby increasing the gain. In at least one embodiment, the oscillation frequency of an LC oscillator varies much less than the oscillation frequency of a CMOS-based oscillator, which may further relax receiver design. In at least one embodiment of transmitter 702, signal DATA and signal DATA_B control oscillator 800 according to an implementation of data-edge-encoded modulation scheme described further below.

A conventional receiver of an isolation communications channel includes a low input impedance, low pass front-end, followed by high-power gain stages that provide an amplified received signal to a demodulator. In at least one embodiment of isolation communications system 700, receiver 704 includes bandpass receiver front-end 710 that lowers the input impedance for the lower frequency common-mode transient signal to implement a relatively low common-mode transient signal gain (i.e., attenuates common-mode transient signals), and increases the input impedance for a high frequency carrier signal (e.g., 5 GHz) to implement a higher gain for the carrier signal. Accordingly, receiver front end 710 has a signal-to-noise ratio that is improved by $Q^2$, as compared to a conventional receiver front end, where Q is the quality factor of the inductor of receiver front-end 710. Thus, receiver front end 710 reduces or eliminates common-mode transient interference using a moderate Q inductor and direct demodulation, described further below.

Figure 11:
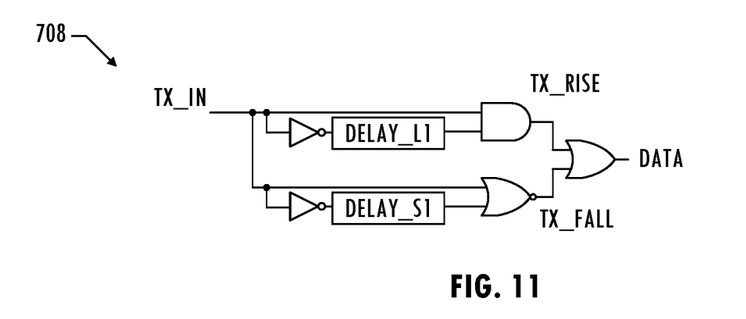
FIG. 11 illustrates a logic diagram of an exemplary encoding circuit of the isolation communications system of FIG. 7 consistent with at least one embodiment of the invention.

Referring to FIGS. 7 and 11, in at least one embodiment, digital circuit 708 receives a data signal TX_IN for transmission across isolation barrier 725. Digital circuit 708 generates signal TX_RISE, which includes an active pulse having a first pulse width in response to a rising edge of data signal TX_IN, and signal TX_FALL, which includes an active pulse having a second pulse width in response to a falling edge of data signal TX_IN. In at least one embodiment, circuit DELAY_L1 and circuit DELAY_L2 include paths having different delays, which causes the first pulse width and the second pulse width to be different. Note that digital circuit 708 is exemplary only and pulses of different durations in response to rising edges or falling edges of data signal TX_IN may be generated using different combinations of digital logic.

Referring to FIGS. 7, and 8, in at least one embodiment, signal DATA controls operation of transmitter front end 706 by selectively providing power to oscillator 800 according to the value of signal DATA. For example, when signal DATA has a first logic level (e.g., DATA='1'), then the center tap of inductor 802 is coupled to a power supply voltage (e.g., VDD) causing oscillator 800 to drive a differential oscillating signal on the differential pair of nodes TXO+ and TXO− coupled to isolation capacitors 720. When signal DATA has a second logic level (e.g., DATA='0'), then the center tap of inductor 802 is coupled to a second power supply voltage (e.g., ground) causing oscillator 706 to cease oscillation and to discharge the differential pair of nodes TXO+ and TXO−. In at least one embodiment, oscillator 800 is an LC oscillator and may have a class-A, class-B, class-C, or class-D oscillator topology.

Figure 9:
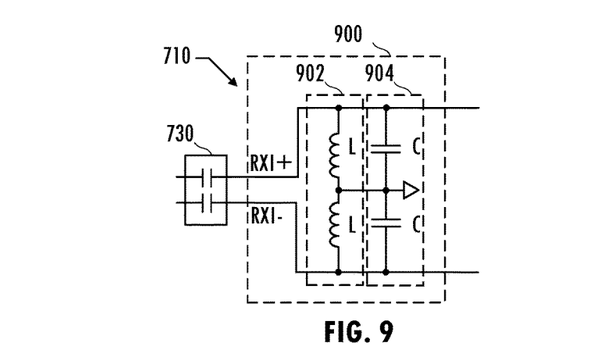
FIG. 9 illustrates a functional block diagram of an exemplary receiver front-end of the isolation communications system of FIG. 7 consistent with at least one embodiment of the invention.

Referring to FIGS. 7 and 9, in at least one embodiment, receiver front end 710 includes isolation capacitors 730 coupled to differential pair of nodes RXI+ and RXI−. In at least one embodiment, filter 900 is a parallel LC filter that amplifies the received carrier signal and attenuates common-mode transient noise. In at least one embodiment, resistors RCM separate differential pair of nodes RXI+ and RXI− and have resistances (e.g., 3 kΩ to 10 kΩ) that are sufficient to provide a bias path to node RX_VCM. In other embodiments, resistors RCM are excluded. Receiver front end 710 presents a high gain at the carrier signal frequency of an exemplary differential signal on differential pair of nodes RXI+ and RXI−. In at least one embodiment, receiver front end 710 has common-mode transient immunity to 200 kV/μs events. In at least one embodiment, differential signal on differential pair of nodes RXI+ and RXI− is relatively small (e.g., 10 mV). Referring to FIGS. 8 and 9, in at least one embodiment, oscillator 800 and filter 900 include matched LC components, e.g., inductor 802 and inductor 902 have the same inductance and capacitor 804 and capacitor 904 have the same capacitance.

Figure 10:
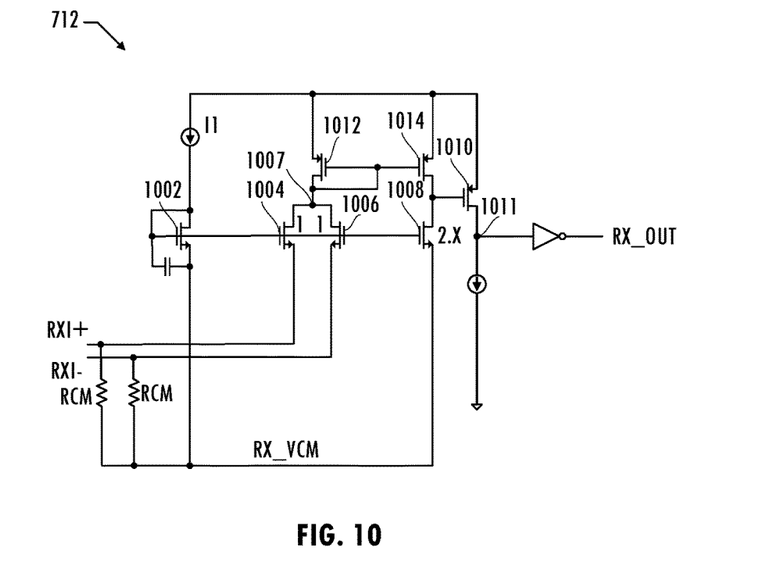
FIG. 10 illustrates a circuit diagram of an exemplary demodulator of the isolation communications system of FIG. 7 consistent with at least one embodiment of the invention.

Referring to FIGS. 7 and 10, in at least one embodiment of receiver 704, demodulator 712 is an offset-bias-free, low power, high-frequency differential signal demodulator circuit. Demodulator 712 has a threshold voltage determined by a ratio of transistor sizes of reference transistor 1008 and the combined size of transistor 1004 and transistor 1006. Demodulator 712 directly demodulates an AC signal received from receiver front-end 710 (i.e., demodulates the differential signal on differential nodes of the LC filter without additional amplification) to a demodulated received signal with relatively small delay (e.g., a delay of less than 20 ns). To enable data-rate scalability and an ultra-low power channel (e.g., current of less than 10 µA), isolation communications system 700 implements a data-edge decoding scheme to decode information received across the isolation barrier using a carrier signal, as discussed further below.

In at least one embodiment, receiver front end 710 is directly coupled to demodulator 712, i.e., no gain stages are coupled between filter 900 of receiver front end 710 and demodulator 712. The absence of gain stages between receiver front end 710 and demodulator 712 reduces power consumption of receiver 704 as compared to a conventional demodulator circuit. Differential pair of nodes RXI+ and RXI− are directly coupled to source terminals of a differential pair of transistors in demodulator 712. Demodulator 712 has a DC bias point at ground of receiver front end 710. Receiver front end 710 provides a filtered received signal to demodulator 712. In at least one embodiment, unlike the conventional demodulator topology that requires an offset voltage to make the signal positive, demodulator 712 does not generate an offset voltage for low input voltage biasing. The common mode voltage of the input signals and the DC bias point of demodulator 712 are approximately at ground of the LC network.

In at least one embodiment, demodulator 712 is an extremum detector (e.g., a peak detector or a valley detector). Transistors 1004 and transistor 1006 of the differential pair of transistors are the same size (e.g., one unit) and reference transistor 1008 has a size of 2.×times the size of transistor 1004 or transistor 1006 (e.g., 2.×units, where 0<x<10) to provide a relatively small bias signal and no other bias or offset voltage generation is used. Reference transistor 1008 sets a threshold voltage for the output level of demodulator 712. Bias transistor 1002 is configured to generate a bias voltage provided to the gate terminals of transistor 1004, transistor 1006, and reference transistor 1008. In at least one embodiment, resistors RCM between the source of reference transistor 1008 and the differential pair of nodes RXI+ and RXI− have resistances (e.g., 3 kΩ to 10 kΩ) that are sufficient to provide a bias path to node RX_VCM. In other embodiments, resistors RCM are excluded. The output on node 1007 has the carrier signal removed and is representative of the signal on differential pair of nodes RXI+ and RXI−. A current mirror formed by transistor 1012 and transistor 1014 sets the voltage on the drain of reference transistor 1008 and the gate of output transistor 1010.

In normal operation, demodulator 712 removes the carrier signal from a received differential pair of signals on differential pair of nodes RXI+ and RXI− and compares the demodulated signal to a reference signal to generate a logic '0' signal or a logic '1' signal based on the comparison. In at least one embodiment, demodulator 712 detects the lesser signal of the differential pair of signals. In at least one embodiment, demodulator 712 includes a minimum selector (or a maximum selector) that identifies which signal has the minimum (or the maximum, as the case may be) of greater magnitude. Demodulator 712 generates an indication of a difference between the voltage on node 1007 (e.g., generated by the current through node 1007, which is the sum of the currents through transistors 1004 and 1006) to the voltage on the drain terminal of transistor 1008 (e.g., generated by the current through the drain terminal of transistor 1008). If the signal on differential pair of nodes RXI+ and RXI− causes the current through node 1007 to be less than the current through transistor 1008, then the voltage on node 1007 is greater than the voltage on the drain of transistor 1008. If the voltage on node 1007 causes the gate-to-source voltage of output transistor 1010 to exceed the threshold voltage of transistor 1010, then transistor 1010 turns on, charges node 1011 and causes signal RX_OUT to have a low logic level. If the signal on differential pair of nodes RXI+ and RXI− causes the current through node 1007 to be greater than the current through transistor 1008, then the voltage on node 1007 is less than the voltage on the drain of transistor 1008. If the output of the differential node causes the gate-to-source voltage of output transistor 1010 to be below the threshold voltage of transistor 1010, then transistor 1010 is disabled, node 1011 discharges, causing signal RX_OUT to have a high logic level.

Figure 12:
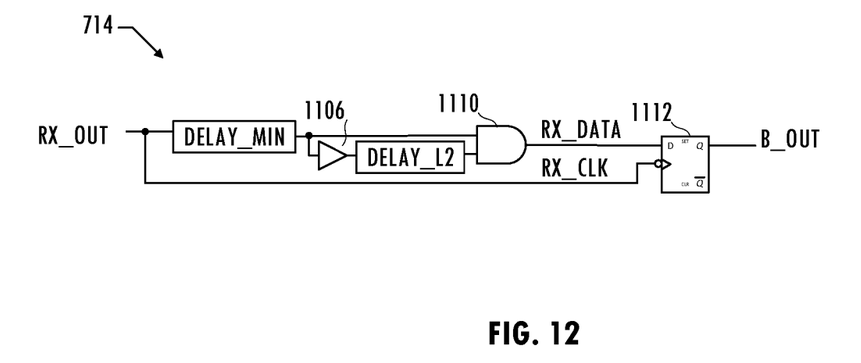
FIG. 12 illustrates a logic diagram of an exemplary decoding circuit of the isolation communications system of FIG. 7 consistent with at least one embodiment of the invention.

Referring to FIGS. 7 and 12, in at least one embodiment, demodulator 712 provides signal RX_OUT to digital circuit 714. Digital circuit 714 decodes a data edge pulse width of signal RX_OUT. For example, digital circuit 714 uses signal RX_OUT as a clock control signal that triggers storage of a value of intermediate signal RX_DATA in storage element 1112 on the falling edge of clock signal RX_CLK (e.g., RX_OUT). Intermediate signal RX_DATA includes a pulse indicating detection of a pulse having a first pulse width (e.g., a 40 ns pulse width) and in an embodiment is generated by introducing a minimum delay and an extended delay using circuit DELAY MIN and circuit DELAY_L2, logic device 1110, and buffer 1106, respectively. Digital circuit 714 sets the decoded received signal B_OUT in response to detecting the pulse having a first pulse width. Intermediate signal RX_DATA is reset (e.g., '0') in response to detecting a second pulse having a second pulse width (e.g., a 20 ns pulse width) that is different from the first pulse width (e.g., a smaller pulse width), causing digital circuit 714 to reset the decoded received signal B_OUT in response to detecting the pulse having the second pulse width. Note that digital circuit 714 is exemplary only and other logic circuits may be used to generate decoded received signal B_OUT based on signal RX_OUT.

Figure 13:
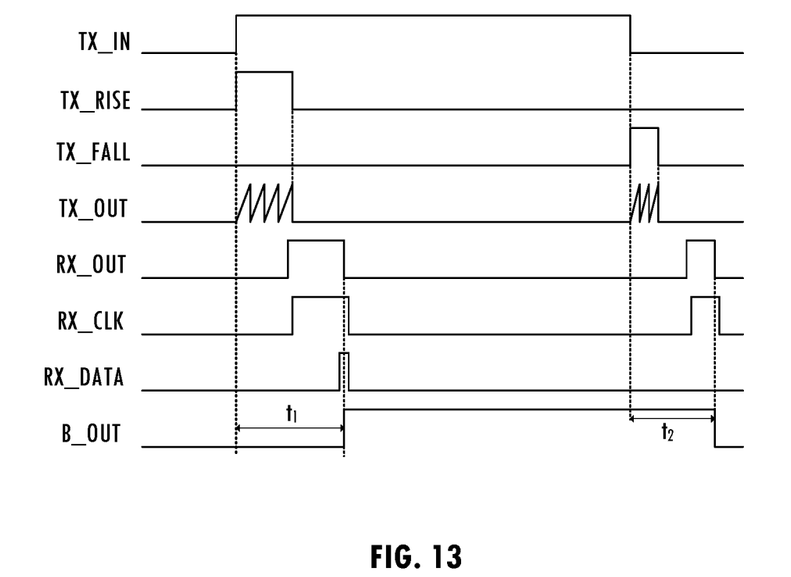
FIG. 13 illustrates exemplary waveforms for the isolation communications system of FIG. 7 consistent with at least one embodiment of the invention.

Referring to FIGS. 7 and 13, an exemplary embodiment of isolation communications system 700 implements a data-edge-triggered pulse-width encoding scheme that transmits a carrier signal for a first interval (i.e., transmits a modulated pulse) having a first width in response to a first transition of a data signal (e.g., a rising transition) and transmits the carrier signal for a second interval (i.e., transmits a modulated pulse) having a second width in response to a second transition of the data signal (e.g., a falling transition). For example, when data signal TX_IN transitions high, digital circuit 708 generates a pulse of signal TX_RISE and creates a corresponding pulse of signal DATA, which causes transmitter front end 706 to provide a modulated pulse of the carrier signal on TXO+ and TXO− for a first interval corresponding to a first pulse width, as illustrated by signal TX_OUT. In response, receiver 704 generates a pulse of signal RX_OUT having the first width and digital circuit 714 generates a pulse of the first width on signal RX_CLK used to capture the pulse of signal RX_DATA, thereby causing the digital signal B_OUT to transition high after time $t_1$ from the rising edge of data signal TX_IN.

When data signal TX_IN transitions low, digital circuit 708 generates a pulse of signal TX_FALL having a second width and creates a corresponding pulse of signal DATA, which causes transmitter front end 706 to provide the carrier signal on TXO+ and TXO− for a second interval corresponding to a second pulse width, as illustrated by signal TX_OUT. In response, receiver 704 generates a pulse of signal RX_OUT having the second width and digital circuit 714 generates a pulse of the second width on signal RX_CLK used to capture a low level of signal RX_DATA, thereby causing the digital signal B_OUT to transition low after time $t_2$ from the rising edge of data signal TX_IN.

Figure 14:
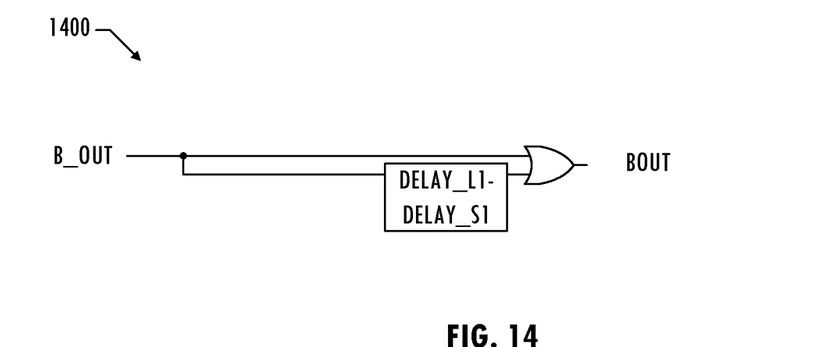
FIG. 14 illustrates a functional block diagram of an exemplary pulse width correction circuit of the receiver of the isolation communications system of FIG. 7 consistent with at least one embodiment of the invention.

In at least one embodiment, transmission of data using the data-edge encoding scheme can introduce a pulse width error into digital signal B_OUT. For example, the delay between a rising edge of data signal TX_IN to a corresponding rising edge of B_OUT includes the delay through the isolation communications channel (DELAY_CH) and the delay to the falling edge of the corresponding pulse on RX_OUT (DELAY_L1), i.e., $t_1$=DELAY_CH+DELAY_L1 (e.g., approximately 30 ns+20 ns=50 ns). However, the delay between a falling edge of data signal TX_IN to a corresponding falling edge of digital signal B_OUT includes the delay through the isolation communications channel (e.g., DELAY_CH) and the delay to the falling edge of the corresponding pulse on RX_OUT (e.g., DELAY_S1), i.e., $t_2$=DELAY_CH+DELAY_S1 (e.g., approximately 30 ns). Since the first pulse width is different from the second pulse width and DELAY_L1>DELAY_L2>DELAY_S1>DELAY_MIN2, digital signal B_OUT is high for a shorter interval than TX_IN is high. In at least one embodiment, pulse-width correction circuit 1400 adjusts the delay of the decoded signal to account for a pulse width error. For example, if DELAY_L1 is 40 ns, DELAY_L2 is 30 ns, DELAY_S1 is 20 ns, and DELAY_MIN2 is 5 ns, pulse width correction circuit 1400 delays the falling edge of B_OUT by an amount equal to DELAY_L1−DELAY_S1 (e.g., 40 ns−20 ns=20 ns).

In at least one embodiment of isolation communications system 700, an alternative to data-edge encoding and pulse width correction, isolation communications system 700 synchronizes the input and output process using a timer and generates a pulse of a predetermined width in response to a rising edge of data signal TX_IN, generates a pulse of the predetermined width in response to a falling edge of the data signal, and no pulse width distortion occurs. Such embodiments toggle digital signal B_OUT in response to detecting a pulse and no pulse width correction is needed.

In at least one embodiment of isolation communications system 700, an integrated circuit die including an integrated circuit inductor and capacitor and both receiver circuitry and transmitter circuitry can be digitally configured as a transmitter or a receiver of isolation communications system 700 by selectively coupling the integrated circuit inductor and capacitor using integrated circuit switches as part of oscillator 800 of FIG. 8 or as part of filter 900 of FIG. 9. Accordingly, the inductors and capacitors in embodiments of transmitter 702 and receiver 704 are matched because they are manufactured using the same manufacturing technology, are surrounded by the same integrated circuit devices, and are subject to the same process variations.

Thus, an isolation communications channel that directly demodulates an encoded signal received has common-mode transient immunity uses data-edge encoding scheme has been disclosed. The isolation communications channel consumes less power than conventional isolation communications channels and the power consumption is data rate dependent. The parallel LC filter used in the receiver front end increases signal gain while attenuating common-mode transient noise and improves the signal-to-noise ratio of the receiver by $Q^2$, where Q is the quality factor of the inductor. Direct demodulation of the signal received across the isolation barrier reduces current consumption to less than 10 μA for a target manufacturing technology as compared to milli-Amps of current in conventional isolators.

The pulse-width data-edge encoding and decoding scheme and associated oscillator are enabled according to the data, thereby reducing power consumption as compared to other encoding and decoding schemes having an oscillator always enabled. During normal operation, sensing a single pulse's rising edge and toggling the output at the receiver and using direct demodulation reduces power, especially in applications using a substantial number of isolators or in applications having a relatively low data rate. However, common-mode transient immunity and the reduction in power consumption trades off potentially increased electromagnetic interference due to use of a higher carrier frequency. Use of the data-edge encoding and decoding scheme reduces the duty cycle, and thus reduces electromagnetic interference as compared to encoding schemes that have the oscillator enabled longer. In at least one embodiment, a conventional frequency spreading techniques can be employed to further reduce electromagnetic interference.

The description of the invention set forth herein is illustrative and is not intended to limit the scope of the invention as set forth in the following claims. For example, while the invention has been described in an embodiment in which an LC oscillator is used at the transmitter and a LC bandpass filter is used in the receiver, one of skill in the art will appreciate that the teachings herein can be utilized with other types of oscillators at the transmitter or other types of bandpass filters at the receiver. The terms "first," "second," "third," and so forth, as used in the claims, unless otherwise clear by context, is to distinguish between different items in the claims and does not otherwise indicate or imply any order in time, location or quality. For example, "a first received signal," "a second received signal," does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. An apparatus for communicating across an isolation barrier, the apparatus comprising:
    a differential pair of input terminals;
    a bandpass filter circuit configured to receive a received signal on the differential pair of input terminals and to provide a received differential signal on a differential pair of nodes;
    a demodulator directly coupled to the bandpass filter circuit and configured to directly demodulate the received differential signal on the differential pair of nodes to provide a demodulated received signal; and
    a transmitter path including an oscillator circuit configured to provide an oscillating signal to a differential pair of output terminals in response to a control signal, wherein the bandpass filter circuit includes a first inductor and a first capacitor matched to a second inductor and a second capacitor of the oscillator circuit.

2. The apparatus of claim 1 wherein the bandpass filter circuit is configured to amplify a first frequency band of the received signal and to attenuate a second frequency band of the received signal, a carrier signal of the received signal being in the first frequency band and common-mode transient interference of the received signal being in the second frequency band.

3. The apparatus of claim 1 wherein the demodulator includes a differential pair of transistors, each transistor of the differential pair of transistors having a corresponding source terminal coupled to a corresponding node of the differential pair of nodes.

4. The apparatus of claim 1, further comprising a digital circuit configured to provide a received digital signal based on the demodulated received signal, the digital circuit being configured to toggle the received digital signal to a first logic value in response to a pulse of the demodulated received signal having a first width and configured to toggle the received digital signal to a second logic value in response to a second pulse of the demodulated received signal having a second width.

5. The apparatus of claim 1,
further comprising:
the oscillator circuit coupled to the differential pair of output terminals and configured to transmit a signal using the differential pair of output terminals according to a transmit data signal received on a center tap of the second inductor of the oscillator circuit; and
a control circuit configured to generate the transmit data signal having a first modulated pulse with a first pulse width in response to a first transition of an input data signal and to generate a second modulated pulse having a second pulse width in response to a second transition of the input data signal, the first pulse width being greater than the second pulse width.

6. An apparatus for communicating across an isolation barrier, the apparatus comprising:
a differential pair of input terminals;
a bandpass filter circuit configured to receive a received signal on the differential pair of input terminals and to provide a received differential signal on a differential pair of nodes;
a demodulator directly coupled to the bandpass filter circuit and configured to directly demodulate the received differential signal on the differential pair of nodes to provide a demodulated received signal, the demodulator including a differential pair of transistors, each transistor of the differential pair of transistors having a corresponding source terminal coupled to a corresponding node of the differential pair of nodes; and a reference transistor having a first size greater than a sum of second sizes of transistors of the differential pair of transistors.

7. The apparatus of claim 6 further comprising a transmitter path including an oscillator circuit configured to provide an oscillating signal to a differential pair of output terminals in response to a control signal, the bandpass filter circuit including a first inductor and a first capacitor matched to a second inductor and a second capacitor of the oscillator circuit.

8. The apparatus of claim 6 wherein an offset threshold of the demodulator is determined by a ratio of the first size of the reference transistor and a second size of each transistor of the differential pair of transistors.

9. The apparatus of claim 6 wherein the demodulator further includes:
a first resistor coupled between a common node coupled to a first source terminal of the reference transistor and a second source terminal of a first transistor of the differential pair of transistors; and
a second resistor coupled between the common node and a third source terminal of a second transistor of the differential pair of transistors, the first resistor and the second resistor having the same resistance.

10. The apparatus of claim 6 wherein the demodulator further includes a bias transistor having a first gate terminal coupled to second gate terminals of the differential pair of transistors and a third gate terminal of the reference transistor.

11. The apparatus of claim 6 wherein the bandpass filter circuit is configured to amplify a first frequency band of the received signal and to attenuate a second frequency band of the received signal, a carrier signal of the received signal being in the first frequency band and common-mode transient interference of the received signal being in the second frequency band.

12. The apparatus of claim 6, further comprising a digital circuit configured to provide a received digital signal based on the demodulated received signal, the digital circuit being configured to toggle the received digital signal to a first logic value in response to a pulse of the demodulated received signal having a first width and configured to toggle the received digital signal to a second logic value in response to a second pulse of the demodulated received signal having a second width.

13. The apparatus of claim 6, further comprising:
an oscillator circuit coupled to a differential pair of output terminals and configured to transmit a signal using the differential pair of output terminals according to a transmit data signal received on a center tap of an inductor of the oscillator circuit; and
a control circuit configured to generate the transmit data signal having a first modulated pulse with a first pulse width in response to a first transition of an input data signal and to generate a second modulated pulse having a second pulse width in response to a second transition of the input data signal, the first pulse width being greater than the second pulse width.

14. A method for communicating across an isolation barrier, the method comprising:
bandpass filtering a received signal on a differential pair of input terminals to provide a received differential signal on a differential pair of nodes;
directly demodulating the received differential signal on the differential pair of nodes to provide a demodulated received signal;
selectively configuring a first instantiation of an LC circuit on a first integrated circuit die as an LC oscillator circuit; and
selectively configuring a second instantiation of the LC circuit on a second integrated circuit die as a bandpass filter circuit.

15. The method of claim 14 wherein directly demodulating comprises:
biasing a differential pair of transistors;
receiving the received differential signal on first source terminals of the differential pair of transistors; and
generating an indication of a difference between a first voltage on drain terminals of the differential pair of transistors to a second voltage on a drain of a reference transistor.

16. The method of claim 14, further comprising:
decoding a first value of a digital signal based on first pulse having a first pulse width; and
decoding a second value of the digital signal based on a second pulse having a second pulse width smaller than the first pulse width.

17. The method of claim 14 wherein the bandpass filtering amplifies a first frequency band of the received signal and attenuates a second frequency band of the received signal, a carrier signal of the received signal being in the first frequency band and common-mode transient interference of the received signal being in the second frequency band.

18. The method of claim 14, further comprising transmitting across the isolation barrier, a first modulated pulse in response to a first transition of a data signal and a second modulated pulse in response to a next transition of the data signal, the first modulated pulse having a first pulse width and the second modulated pulse having a second pulse width different from the first pulse width.

* * * * *